United States Patent
Wang et al.

(10) Patent No.: US 10,365,523 B2
(45) Date of Patent: Jul. 30, 2019

(54) DISPLAY PANEL AND MANUFACTURING METHOD BASED ON BOA TECHNOLOGY

(71) Applicant: Shenzhen China Star Optoelectronics Technology Co., Ltd., Shenzhen, Guangdong (CN)

(72) Inventors: Haijun Wang, Guangdong (CN); Xia Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 255 days.

(21) Appl. No.: 15/117,197

(22) PCT Filed: May 17, 2016

(86) PCT No.: PCT/CN2016/082304
§ 371 (c)(1),
(2) Date: Aug. 6, 2016

(87) PCT Pub. No.: WO2017/181462
PCT Pub. Date: Oct. 26, 2017

(65) Prior Publication Data
US 2018/0188619 A1    Jul. 5, 2018

(30) Foreign Application Priority Data
Apr. 22, 2016 (CN) .......................... 2016 1 0257360

(51) Int. Cl.
*H01L 27/12* (2006.01)
*G02F 1/1335* (2006.01)
(Continued)

(52) U.S. Cl.
CPC .... *G02F 1/136209* (2013.01); *G02F 1/13394* (2013.01); *H01L 21/0274* (2013.01);
(Continued)

(58) Field of Classification Search
CPC .......... G02B 5/201; G02B 5/22; G02B 5/223; G02B 7/006; G02B 26/007; G02B 5/20;
(Continued)

(56) References Cited

U.S. PATENT DOCUMENTS

2004/0007752 A1    1/2004 Nakata et al.
2011/0005063 A1    1/2011 Lee et al.
(Continued)

FOREIGN PATENT DOCUMENTS

| JP | 2008158138 A | 7/2008 | |
| JP | 2010-085746 | * 4/2010 | ......... G02B 5/20101 |
| JP | 201085746 A | 4/2010 | |

*Primary Examiner* — Evan P Dzierzynski
*Assistant Examiner* — Sharrief I Broome
(74) *Attorney, Agent, or Firm* — Andrew C. Cheng

(57) ABSTRACT

A manufacturing method for a display panel based on BOA technology is disclosed. The method includes an array substrate, wherein, the array substrate includes a display region and a non-display region; forming a color photoresist layer and a black matrix layer on the array substrate, and in a process of forming the color photoresist layer and/or the black matrix layer, forming a spacer simultaneously. A display panel based on BOA technology is also disclose. In the processes of forming the color photoresist layer and/or the black matrix layer, forming the spacer simultaneously to reduce a process for individually forming the spacer such that the manufacturing processes of the display panel are reduced to decrease the production cost.

11 Claims, 10 Drawing Sheets

(51) Int. Cl.
*G02F 1/1339* (2006.01)
*G02F 1/1362* (2006.01)
*H01L 21/027* (2006.01)

(52) U.S. Cl.
CPC ...... *H01L 27/1262* (2013.01); *H01L 27/1288* (2013.01); *G02F 1/133516* (2013.01); *G02F 2001/13396* (2013.01); *G02F 2001/136222* (2013.01); *G02F 2001/136231* (2013.01); *G02F 2201/52* (2013.01)

(58) Field of Classification Search
CPC .. G02B 5/208; G02B 2207/101; G02B 23/12; G02B 26/008; G02B 26/023; G02B 27/58; G02B 5/003; G02B 5/205; G02B 5/23; G02B 5/24; G02B 5/26; G02B 17/023; H04N 9/22; H04N 9/07; H04N 11/00; H04N 9/04; H04N 9/3114; H04N 9/43; H04N 11/02; H04N 11/12; H04N 11/22; H04N 13/0217; H04N 13/0404; H04N 13/0431; H04N 5/2254; H04N 5/33; H04N 5/332; H04N 9/077; H04N 9/083; H04N 9/12
USPC ....... 359/887, 890, 885, 889, 891, 888, 589, 359/886, 892, 590, 900; 348/270, 743, 348/342, 223.1
See application file for complete search history.

(56) References Cited

U.S. PATENT DOCUMENTS

| | | | |
|---|---|---|---|
| 2013/0222723 A1* | 8/2013 | Kim | H01L 33/58 349/40 |
| 2014/0049717 A1 | 2/2014 | Kwak et al. | |
| 2015/0198842 A1* | 7/2015 | Kwak | H01L 27/1248 349/42 |
| 2016/0320663 A1 | 11/2016 | Hao et al. | |

* cited by examiner

DISPLAY PANEL AND MANUFACTURING METHOD BASED ON BOA TECHNOLOGY

BACKGROUND OF THE INVENTION

1. Field of the Invention

The present invention relates to a display technology field, and more particularly to a display panel and a manufacturing method based on BOA technology.

2. Description of Related Art

A thin film transistor-liquid crystal display (TFT-LCD) has features of light, thin and small, and low power consumption, no radiation and relatively low manufacturing cost, therefore, the TFT-LCD is widely used flat display industry. A liquid crystal panel is a main part of the TFT-LCD. The liquid crystal panel can be divided into thin-film transistor array and a color filter substrate. In a traditional TFT-LCD panel, when the color filter substrate is aligned with a pixel electrode, the alignment may not be good to generate a light leakage, decrease an aperture ratio and decrease the brightness of the panel. Besides, applying the TFT-LCD to a curved display panel is limited.

In order to solve the problems of the light leakage and the decrease of the brightness of the panel generated by an inaccurate alignment, combining a technology of integrating the color filter substrate into the array substrate (Color Filter on Array, COA) and a technology of integrating a black matrix into the array substrate (Black matrix on Array, BOA) is developed. Integrating parts of the color filter substrate into the array substrate, that is, manufacturing a color filter layer and a black matrix on the array substrate to overcome the problems generated by the inaccurate alignment. However, the manufacturing processes of the technology of combining COA and BOA are not reduced so that the cost is not improved.

SUMMARY OF THE INVENTION

The technology problem mainly solved by the present invention is to provide a display panel and a manufacturing method based on BOA technology, which can reduce the manufacturing process and reduce the production cost.

In order to solve the above technology problem, a technology solution adopted by the present invention is: a manufacturing method for a display panel based on BOA technology, comprising:

providing an array substrate, wherein, the array substrate includes a display region and a non-display region;

forming a color photoresist layer on the array substrate;

using a mask once to expose the color photoresist layer in order to form a first spacer corresponding to the non-display region;

forming a black matrix layer on the color photoresist layer;

using a mask once to expose the black matrix layer in order to form a second spacer corresponding to the non-display region and/or the first spacer, wherein, heights and positions of the first spacer and the second spacer are different.

In order to solve the above technology problem, another technology solution adopted by the present invention is: a manufacturing method for a display panel based on BOA technology, comprising:

providing an array substrate, wherein, the array substrate includes a display region and a non-display region;

forming a color photoresist layer and a black matrix layer on the array substrate, and in a process of forming the color photoresist layer and/or the black matrix layer, forming a spacer simultaneously.

Wherein, the step of forming a color photoresist layer and a black matrix layer on the array substrate, and in a process of forming the color photoresist layer and/or the black matrix layer, forming a spacer simultaneously comprises:

forming the color photoresist layer on the array substrate, exposing the color photoresist layer in order to form a first spacer corresponding to the non-display region;

forming the black matrix layer on the color photoresist layer; and exposing the black matrix layer in order to form a second spacer corresponding to the non-display region.

Wherein, heights and positions of the first spacer and the second spacer are different.

Wherein, the step of forming the color photoresist layer on the array substrate, exposing the color photoresist layer in order to form a first spacer corresponding to the non-display region comprises:

forming a red photoresist, a green photoresist and a blue photoresist on the array substrate;

making one exposure for a red photoresist layer corresponding to the red photoresist in order to form the red photoresist and the first spacer protruding from the red photoresist;

or, making one exposure for a green photoresist layer corresponding to the green photoresist in order to form the green photoresist and the first spacer protruding from the green color photoresist;

or, making one exposure for a blue photoresist layer corresponding to the blue photoresist in order to form the blue photoresist and the first spacer protruding from the blue color photoresist;

wherein, the first spacer is formed on the non-display region of the array substrate corresponding to the red photoresist, the green photoresist or the blue photoresist.

Wherein, the step of forming the color photoresist layer on the array substrate, exposing the color photoresist layer in order to form a first spacer corresponding to the non-display region comprises:

forming a red photoresist on the array substrate;

coating a green photoresist layer on the red photoresist;

using a mask once to expose the green photoresist layer in order to form a green photoresist and a first spacer, wherein, the first spacer is located on the red photoresist corresponding to the non-display region of the array substrate; a light transmittance of a first region of the mask corresponding to the green photoresist is greater than a light transmittance of a second region of the mask corresponding to the first spacer; a remaining region that is a region of the mask except the first region and the second region is light-blocking film; and forming a blue photoresist on the array substrate.

Wherein, the first region of the mask corresponding to the green photoresist is a light-transmitting film, a light transmittance of the second region of the mask corresponding to the first spacer is greater than a light transmittance of the light-blocking film.

Wherein, the step of exposing the black matrix layer in order to form a second spacer corresponding to the non-display region comprises:

using a mask once to expose the black matrix layer;

after exposing the black matrix layer, the second spacer is formed on the black matrix layer corresponding to the non-display region, wherein, a light transmittance of a first region of the mask corresponding to the second spacer is greater than a light transmittance of a second region that is a region of the mask except the first region; the black matrix layer corresponding to the second region is reserved.

Wherein, a first region of the mask is a light-transmitting film, and a light transmittance of a second region of the mask that is a region of the mask except the first region is greater than a light transmittance of the light-blocking film.

Wherein, the step of in a process of forming the color photoresist layer and/or the black matrix layer, forming a spacer simultaneously comprises:

forming a color photoresist layer on the array substrate, and exposing the color photoresist layer in order to form a recess region and multiple color photoresists, wherein, the recess region is located inside the multiple color photoresists corresponding to the non-display region of the array substrate;

forming a black matrix layer on the color photoresist layer, and the black matrix layer covers the color photoresist layer and the recess region; and exposing the black matrix layer such that a first spacer is formed on the recess region, and a second spacer is formed on the color photoresist layer corresponding to the non-display region of the array substrate.

Wherein, the step of forming a color photoresist layer on the array substrate, and exposing the color photoresist layer in order to form a recess region and multiple color photoresists comprises:

forming a red photoresist layer on the array substrate;

using a mask once to expose the red photoresist layer to form multiple red photoresists and a recess region located inside the multiple red photoresists, wherein, a light transmittance of a first region of the mask corresponding to the red photoresist is greater than a light transmittance of a second region that is a region of the mask except the first region; and forming a green photoresist and a blue photoresist on the array substrate.

Wherein, a first region of the mask corresponding to the red color photoresist is a light-transmitting film, a second region that is a region of the mask except the first region is a light-blocking film.

Wherein, the step of forming a color photoresist layer on the array substrate, and exposing the color photoresist layer in order to form a recess region and multiple color photoresists comprises:

forming a green photoresist layer on the array substrate;

using a mask once to expose the green photoresist layer to form multiple green photoresists and a recess region located inside the multiple green photoresists, wherein, a light transmittance of a first region of the mask corresponding to the green photoresist is greater than a light transmittance of a second region that is a region of the mask except the first region; and forming a red photoresist and a blue photoresist on the array substrate.

Wherein, the step of forming a color photoresist layer on the array substrate, and exposing the color photoresist layer in order to form a recess region and multiple color photoresists comprises:

forming a blue photoresist layer on the array substrate;

using a mask once to expose the blue photoresist layer to form multiple blue photoresists and a recess region located inside the multiple blue photoresists, wherein, light transmittance of a first region of the mask corresponding to the blue photoresist is greater than a light transmittance of a second region that is a region of the mask except the first region; and forming a red photoresist and a green photoresist on the array substrate.

Wherein, the step of exposing the black matrix layer such that a first spacer is formed on the recess region, and a second spacer is formed on the color photoresist layer comprises:

using a mask once to expose the black matrix layer such that the first spacer is formed on the recess region, and the second spacer is formed on the color photoresist layer;

wherein, a light transmittance of the first region of the mask corresponding to the first spacer and the second spacer is greater than a light transmittance of a second region that is a region of the mask except the first region.

Wherein, the first region of the mask corresponding to the first spacer and the second spacer is a light-transmitting film, and the light transmittance of the second region that is a region of the mask except the first region is greater than a light transmittance of a light-blocking film.

In order to solve the above technology problem, another technology solution adopted by the present invention is: a display panel based on BOA technology, comprising:

an array substrate includes a display region and a non-display region;

a color photoresist layer disposed on the array substrate;

a black matrix layer disposed on the color photoresist layer; and a spacer disposed in the non-display region of the array substrate, and the spacer is formed in a process of forming the color photoresist layer and/or the black matrix layer.

Wherein, the spacer includes a first spacer and a second spacer, and heights and positions of the first spacer and the second spacer are different;

the first spacer is formed in a formation process of the color photoresist layer; and the second spacer is formed in a formation process of the black matrix layer.

Wherein, the color photoresist layer includes a red photoresist, a green photoresist and a blue photoresist;

the red photoresist and the first spacer are formed by making one exposure for a red photoresist layer corresponding to the red photoresist;

or, the green photoresist and the first spacer are formed by making one exposure for a green photoresist layer corresponding to the green photoresist;

or, the blue photoresist and the first spacer are formed by making one exposure for a blue photoresist layer corresponding to the blue photoresist.

Wherein, the spacer includes a first spacer and a second spacer, and heights and positions of the first spacer and the second spacer are different;

the first spacer and the second spacer are formed in a formation process of the black matrix layer.

The beneficial effects of the present invention are: comparing to the conventional art, the present invention through providing an array substrate, wherein, the array substrate includes a display region and a non-display region; forming a color photoresist layer and a black matrix layer on the array substrate, and in a process of forming the color photoresist layer and/or the black matrix layer, forming a spacer simultaneously. Through above way, in the processes of forming the color photoresist layer and/or the black matrix layer, forming the spacer simultaneously to reduce a process for individually forming the spacer such that the manufacturing processes of the display panel are reduced to decrease the production cost.

DETAILED DESCRIPTION OF THE PREFERRED EMBODIMENT

In order to make the person skilled in the art to understand the technology better, the following content combines with drawings and specific embodiments for describing the display panel and the manufacturing method based on BOA technology in detail.

Figure 1:
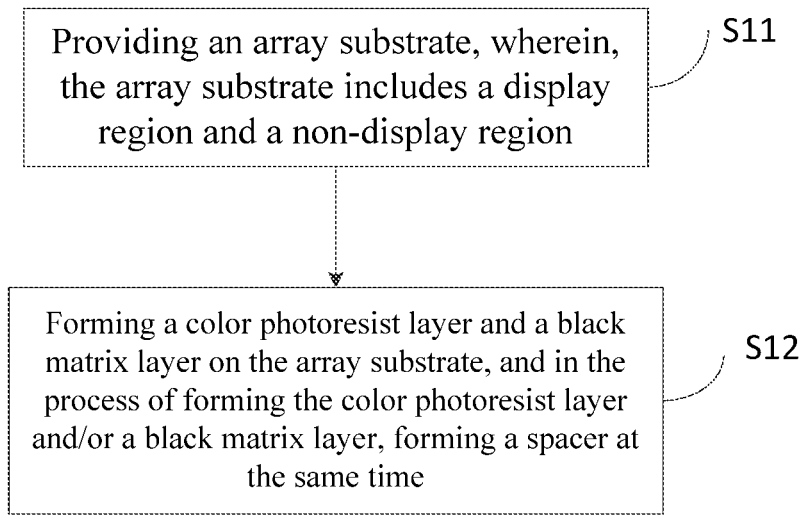
FIG. 1 is a flow chart of a manufacturing method for a display panel based on BOA technology of a first embodiment of the present invention.

With reference to FIG. 1, which is a flow chart of a manufacturing method for a display panel based on BOA technology of a first embodiment of the present invention, and the method includes:

Step S11: providing an array substrate, wherein, the array substrate includes a display region and a non-display region;

In the step S11, manufacturing an array substrate, the array substrate can include a data line, a scanning line, a thin-film transistor and a pixel electrode. The array substrate includes a display region for displaying an image and a non-display region located outside the display region for separating or distinguishing different pixels.

Step S12: forming a color photoresist layer and a black matrix layer on the array substrate, and in the process of forming the color photoresist layer and/or a black matrix layer, forming a spacer at the same time.

In the step S12, forming the color photoresist and the black matrix layer on the array substrate such that the color photoresist layer and the pixel electrode are precisely aligned, the spacer is located on the array substrate for providing a reservation space for the array substrate and an opposite substrate, usually a glass substrate, in order to fill liquid crystals, and supporting the array substrate and the opposite substrate at the same time.

The formation of the spacer can be in the process of forming the color photoresist layer or in the process of forming the black matrix layer. Or, in the processes of forming the color photoresist layer and the black matrix layer to form two kinds of same or different spacers.

Figure 2:
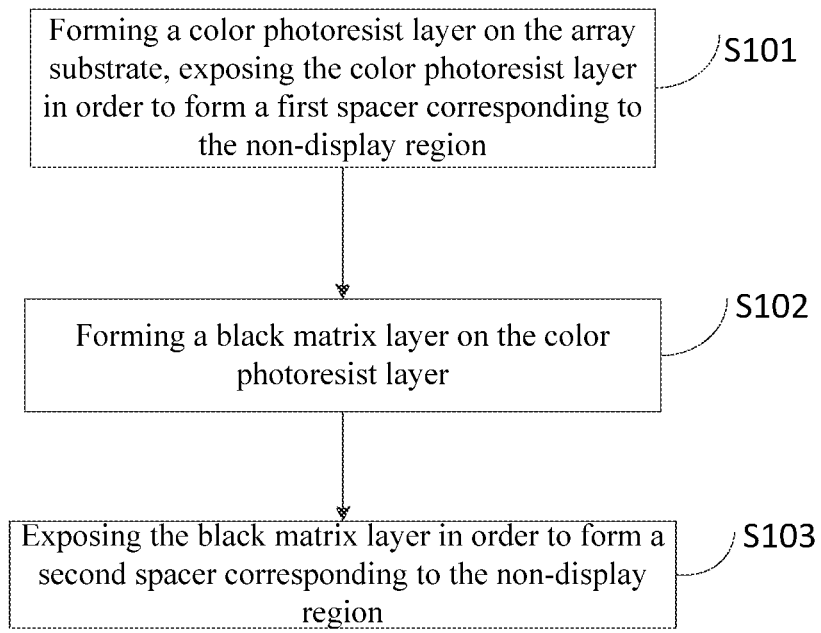
FIG. 2 is a flow chart of an application of the step S12 in FIG. 1.

In an actual application, in order to have a good supporting function, the spacer is usually divided into two types. One is a main spacer for providing a main supporting function. The other is an auxiliary spacer, and a height of the auxiliary spacer is less than a height of the main spacer. A location of the auxiliary spacer is different from a location of the main spacer such that when a display panel is compresses, an auxiliary supporting function is provided. The formation of the main spacer and the auxiliary spacer can be formed in a formation process of the color photoresist layer, or be formed in a formation process of the black matrix layer; or the main spacer is formed in a formation process of the color photoresist layer and the auxiliary spacer is formed in a formation process of the black matrix layer; or the auxiliary spacer is formed in a formation process of the color photoresist layer and the main spacer is formed in a formation process of the black matrix layer A method of an application of the present embodiment is that the auxiliary spacer is formed in the manufacturing process of the color photoresist layer, and the main spacer is formed in the process of forming the black matrix layer. As shown in FIG. 2, the specific steps are:

Sub-step S101: forming a color photoresist layer on the array substrate, exposing the color photoresist layer in order to form a first spacer corresponding to the non-display region;

In the step S101: the first spacer means the auxiliary spacer.

On the display region of the array substrate, forming a corresponding color photoresist. The color photoresist can include one or a combination of a red photoresist, a green photoresist and a blue photoresist. When using a corresponding mask to patterning the color photoresist layer, forming the first spacer simultaneously. The formation of the first spacer can adopt three ways:

First way: making one exposure for a red photoresist layer corresponding to the red photoresist in order to form the red photoresist and the first spacer protruding from the red photoresist;

Specifically, before forming the red color photoresist, the green photoresist and/or the blue photoresist can be formed in advance. A portion of the red photoresist layer will cover the green photoresist and/or the blue photoresist. The other portion of the red photoresist layer is located at a same layer with the green photoresist and/or the blue photoresist. Making one exposing for the red photoresist layer in order to form the red photoresist and the first spacer. The first spacer is formed on the green photoresist and/or the blue photoresist. In some situations, the first spacer can be formed on the red photoresist, and the first spacer is protruding from the red photoresist and is formed integrally with the red photoresist.

Second way: making one exposure for a green photoresist layer corresponding to the green photoresist in order to form the green photoresist and the first spacer protruding from the green color photoresist;

Specifically, before forming the green color photoresist, the red photoresist and/or the blue photoresist can be formed in advance. A portion of the green photoresist layer will cover the red photoresist and/or the blue photoresist. The other portion of the green photoresist layer is located at a same layer with the red photoresist and/or the blue photoresist. Making one exposure for the green photoresist layer in order to form the green photoresist and the first spacer. The first spacer is formed on the red photoresist and/or the blue photoresist. In some situations, the first spacer can be formed on the green photoresist, and the first spacer is protruding from the green photoresist and is formed integrally with the green photoresist.

Third way: making one exposure for a blue photoresist layer corresponding to the blue photoresist once in order to form the blue photoresist and the first spacer protruding from the blue color photoresist;

Specifically, before forming the blue color photoresist, the red photoresist and/or the green photoresist can be formed in advance. A portion of the blue photoresist layer will cover the red photoresist and/or the green photoresist. The other portion of the blue photoresist layer is located at a same layer with the red photoresist and/or the green photoresist. Making one exposure for the blue photoresist layer in order to form the blue photoresist and the first spacer. The first spacer is formed on the red photoresist and/or the green photoresist. In some situations, the first spacer can be formed on the blue photoresist, and the first spacer is protruding from the blue photoresist and is formed integrally with the blue photoresist.

The first spacer is formed on the non-display region of the array substrate corresponding to the red photoresist, the green photoresist or the blue photoresist.

Sub-step S102: forming a black matrix layer on the color photoresist layer;

After the color photoresist layer and the first spacer are formed, forming a black matrix layer on the non-display region of the array substrate corresponding to the color photoresist layer. Generally, the function of the black matrix is to block the light emitted from the backlight source from leaking out from the non-display region in order to avoid the light leakage phenomenon.

Sub-step S103: exposing the black matrix layer in order to form a second spacer corresponding to the non-display region.

In the step S103, the second spacer is the main spacer. Exposing the black matrix layer in order to leave a black matrix layer which is remained on the color photoresist layer, simultaneously, on the black matrix layer which is remained, the second spacer is formed and protruding from the black matrix layer which is remained.

Specifically, using a mask once to expose the black matrix layer. The mask can be a half-tone mask. A light transmittance of a first region of the mask corresponding to the second spacer is greater than a light transmittance of a second region that is a region of the mask except the first region. After exposing the black matrix layer, a portion corresponding to the second region of the mask leaves a remaining black matrix layer. A portion corresponding to the first region of the mask forms the second spacer protruding from the remaining black matrix layer.

It should be noted that the manufacturing sequence of the step S11 and S12 are not fixed. In some situations, the step S12 can be implemented first, and through the step S12 to form the color photoresist. Then, through step S11 to form the array substrate. Then, continue to form the black matrix layer and the spacer. Accordingly, the sequence of the step S11 and the step S12 is not limited by the present embodiment, and should be based on an actual requirement.

It can be understood, in the manufacturing method for a display panel based on BOA technology of the first embodiment of the present invention, through providing an array substrate, the array substrate includes a display region and a non-display region; forming a color photoresist layer and a black matrix layer on the array substrate, in a process of forming the color photoresist layer forming the first spacer, and in a process of forming the black matrix layer, forming the second spacer. In the processes of forming the color photoresist layer and the black matrix layer, respectively forming the first spacer and the second spacer in order to reduce a process for individually forming the first spacer and the second spacer such that the manufacturing processes of the display panel are reduced to decrease the production cost.

Figure 3:
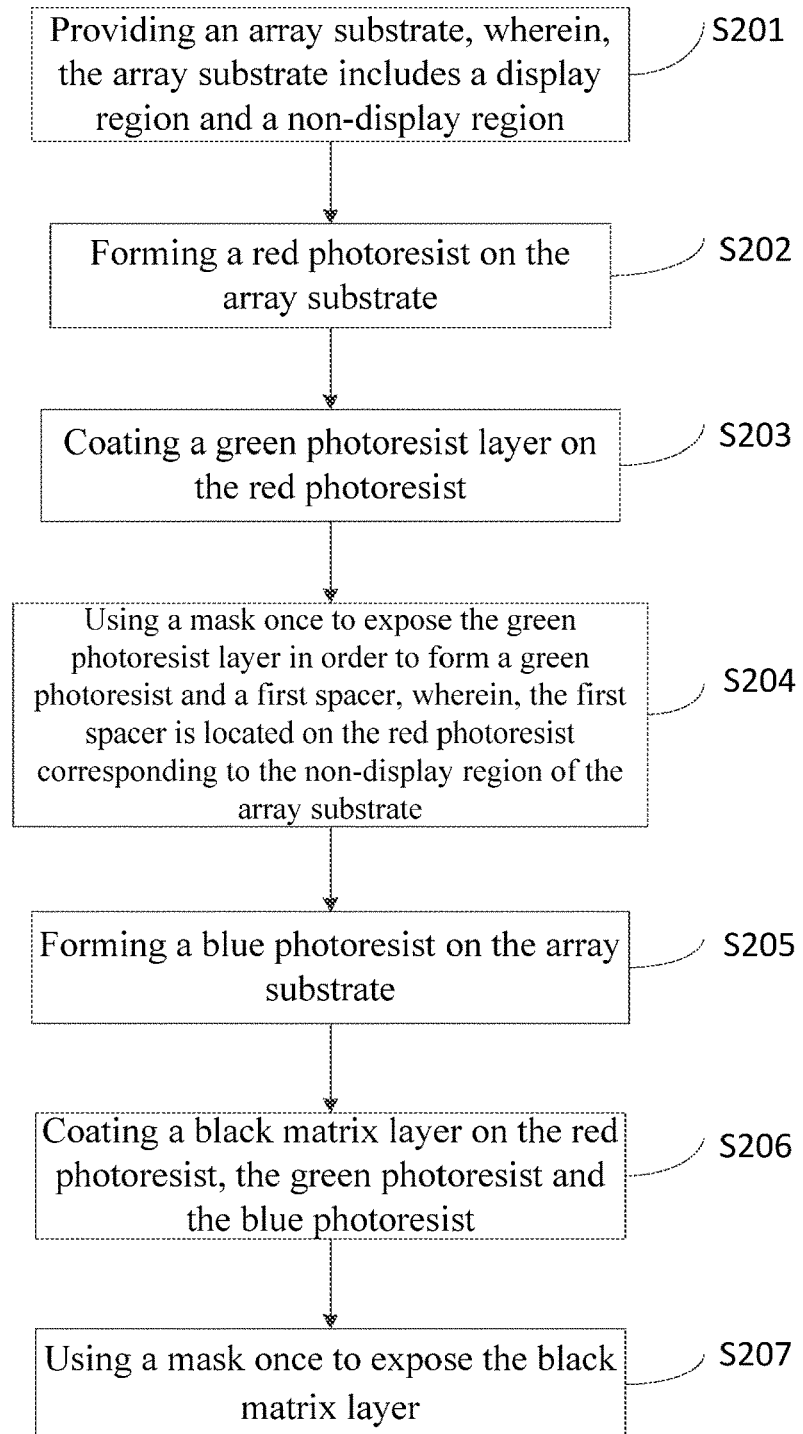
FIG. 3 is a flow chart of a manufacturing method for a display panel based on BOA technology of a second embodiment of the present invention.
Figure 4A:
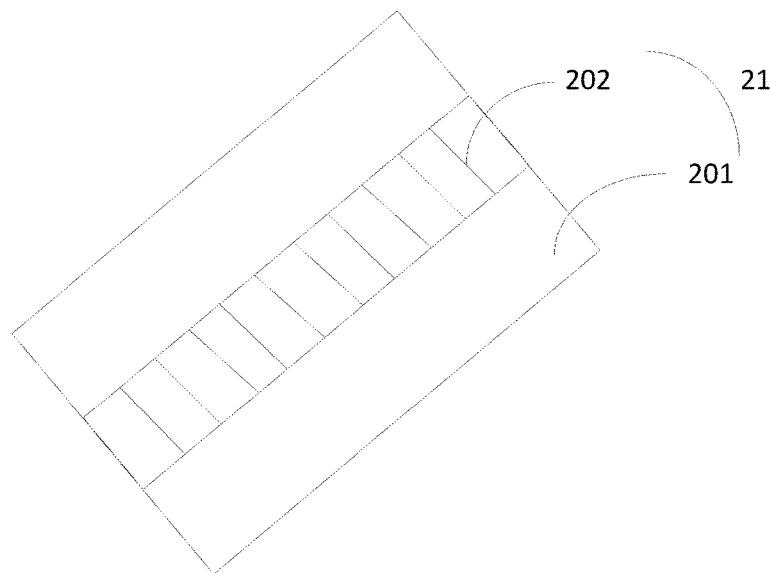
FIG. 4a is a top view of the array substrate in the step S201 in FIG. 3.
Figure 4B:
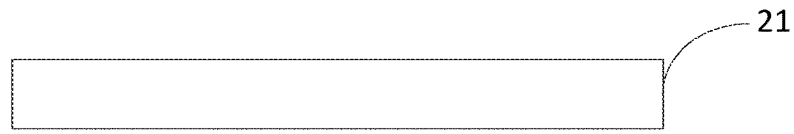
FIG. 4b-FIG. 4h is a cross-sectional view of each step in FIG. 3.

With reference to FIG. 3, which is a flow chart of a manufacturing method for a display panel based on BOA technology of a second embodiment of the present invention, FIG. 4b-FIG. 4h is a cross-sectional view of the display panel of each step of the second embodiment of the present invention, and the manufacturing method of the display panel specifically includes following steps:

Step S201: providing an array substrate 21, wherein, the array substrate 21 includes a display region 201 and a non-display region 202;

With reference to FIG. 4a-FIG. 4b, wherein, FIG. 4a is a top view of an array substrate 21 manufactured through step S201, FIG. 4b is a cross-sectional view of the array substrate 21. In the array substrate 21 provided, the array substrate 21 can include a data line, a scanning line, a thin-film transistor, a pixel electrode and so on (all not shown in the figures). The array substrate 21 includes a display region 201 for displaying an image and a non-display region 202 for separating or distinguishing different pixels.

Figure 4C:
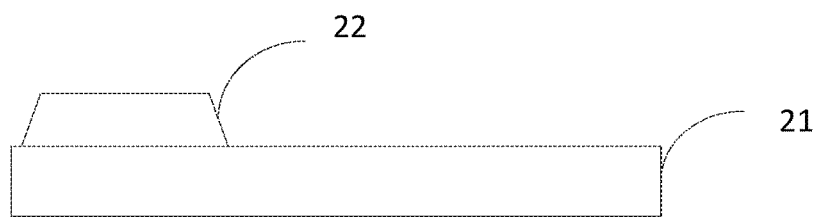

Step S202: forming a red photoresist 22 on the array substrate 21;

As shown in FIG. 4c, which is a cross-sectional view of forming the red photoresist 22 on the array substrate 21. Coating a red photoresist layer on the array substrate 21, patterning the red photoresist layer in order to form the red photoresist 22.

Figure 4D:
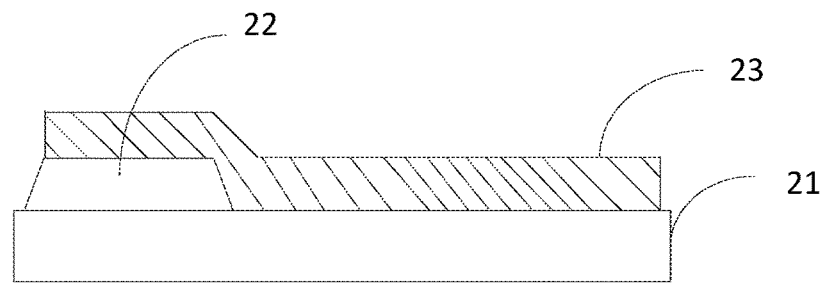

Step S203: coating a green photoresist layer 23 on the red photoresist 22;

As shown in FIG. 4d, coating a green photoresist layer 23 on the red photoresist 22, and the green photoresist layer 23 covers the red photoresist 22 and is extended on the array substrate 21.

Figure 4E:
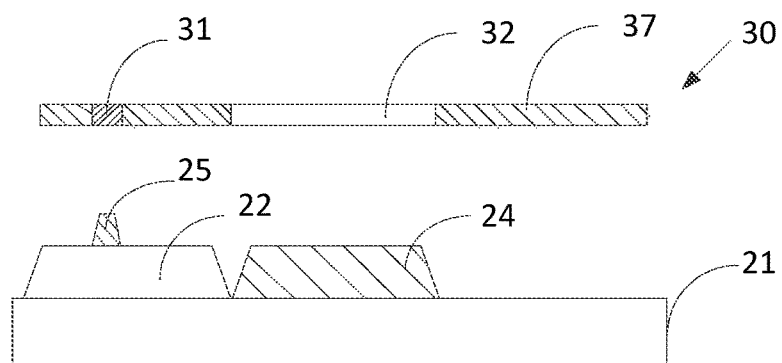

Step S204: using a mask 30 once to expose the green photoresist layer 23 in order to form a green photoresist 24 and a first spacer 25. Wherein, the first spacer is located on the red photoresist 22 corresponding to the non-display region 202 of the array substrate 21;

As shown in FIG. 4e, the mask 30 adopts a material having three different light transmittance properties. A light transmittance of a first region 32 of the mask 30 corresponding to the green photoresist 24 is greater than a light transmittance of a second region 31 of the mask 30 corresponding to the first spacer 25 such that after exposing and developing, the green photoresist layer 23 corresponding to the first region 32 forms the green photoresist 24, and the green photoresist layer 23 corresponding to the second region 31 forms the first spacer 25 protruding from the red photoresist 22. The exposure degree of the first spacer 25 is greater than the exposure degree of the green photoresist 24, which is for the subsequent second spacer 28 so that a height of the first spacer 25 and a height of the second spacer can be different. A remaining region 37 that is a region of the mask 30 except the first region 32 and the second region 31 is light-blocking film. A remaining portion that is a portion of the green photoresist layer 23 except the green photoresist 24 and the first spacer 25 is developed and removed.

In the present embodiment, the first region 32 of the mask 30 corresponding to the green photoresist 24 is a light-transmitting film, after being exposed, the green photoresist layer 23 corresponding to the light-transmitting film is maintained to form the green photoresist 24. A light transmittance of the second region 31 of the mask 30 corresponding to the first spacer 25 is greater than a light transmittance of the light-blocking film. After being exposed, the green photoresist layer 23 corresponding to the second region 31 forms the first spacer 25 protruding from the red photoresist 22. The remaining portion of the green photoresist layer 23 is all developed and removed.

Step S205: forming a blue photoresist 26 on the array substrate 21.

Figure 4F:
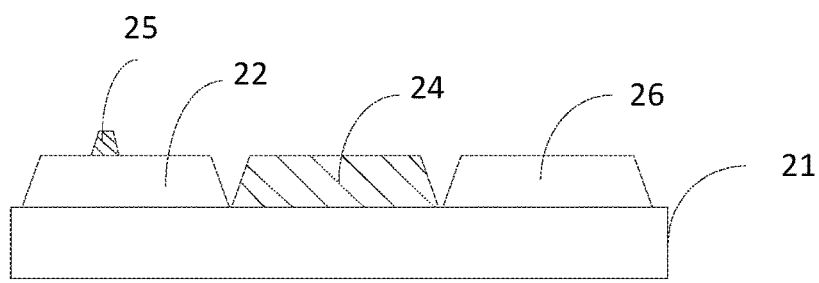

As shown in FIG. 4f, coating a blue photoresist layer on the array substrate 21, patterning the blue photoresist layer to form the blue photoresist 26.

Figure 4G:
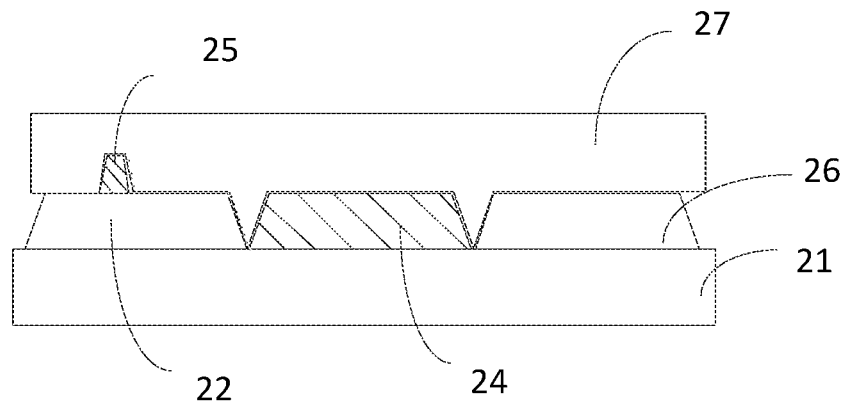

Step S206: coating a black matrix layer 27 on the red photoresist 22, the green photoresist 24 and the blue photoresist 26;

As shown in FIG. 4g, forming a black matrix layer 27 on the red photoresist 22, the green photoresist 24 and the blue photoresist 26 having a certain thickness. The black matrix layer 27 is corresponding to the non-display region 202 of the array substrate 21.

Figure 4H:
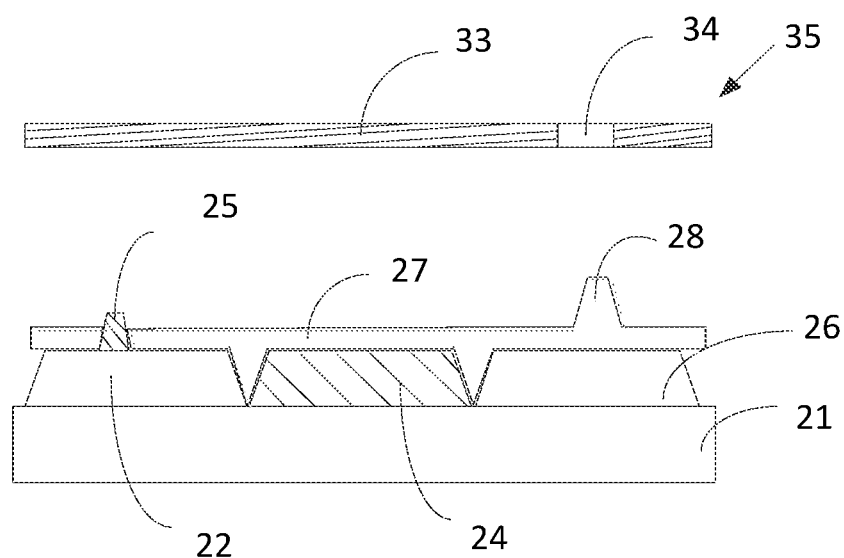

Step S207: using a mask once to expose the black matrix layer 27;

As shown in FIG. 4h, the mask 35 adopts a material having two different light transmitting properties. A first region 34 of the mask 35 is a light-transmitting film. A light transmittance of the second region 33 of the mask 35 is greater than a light transmittance of the light-blocking film. After exposing the black matrix layer 27, a portion of the black matrix layer 27 corresponding to the first region 34 forms the second spacer 28. The second spacer 28 is located at a remaining portion of the black matrix layer 27 corresponding to the second region 33.

Figure 4I:
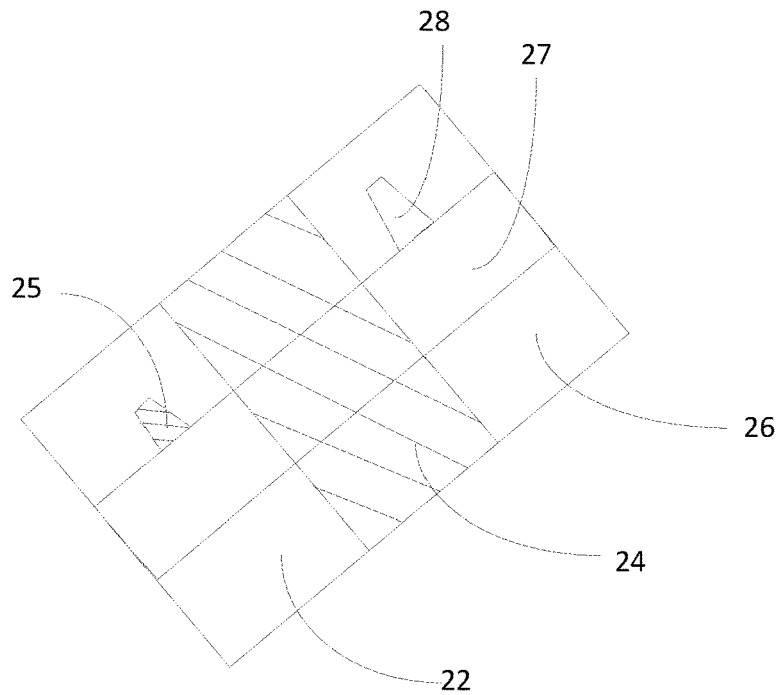
FIG. 4i is a top view of the display panel after the step S207 in FIG. 3.

Utilizing the above steps to finish color photoresists 22/24/26, the black matrix layer 27, the first spacer 25 and the second spacer 28. As shown, heights of the first spacer 25 and the second spacer 28 are different, and positions of the first spacer 25 and the second spacer 28 are different; as shown in FIG. 4i, and FIG. 4i is a top view of FIG. 4h. As shown, the black matrix layer 27, the first spacer 25 and the second spacer 28 are all located at the non-display region 202 of the array substrate 21 corresponding to the color photoresist 22/24/26.

In the manufacturing method for a display panel based on BOA technology of the second embodiment of the present invention, through providing an array substrate 21, forming a red photoresist 22 on the array substrate 21, coating a green photoresist layer 23 on the red photoresist 22, making one exposure for the green photoresist layer 23 in order to form a green photoresist 24 and a first spacer 25, then, forming a blue photoresist 26, coating a black matrix layer 27 on the red photoresist 22, the green photoresist 24 and the blue photoresist 26, making one exposure for the black matrix layer 27 to leave a remaining black matrix layer 27 and form the second spacer. Through the above way, in the processes of forming the color photoresist layer and the black matrix layer, respectively forming the first spacer and the second spacer in order to reduce a process for individually forming the first spacer 25 and the second spacer 28 in order to reduce the processes for manufacturing the first spacer 25 and the second spacer 28 such that the manufacturing processes of the display panel are reduced to decrease the production cost.

Figure 5:
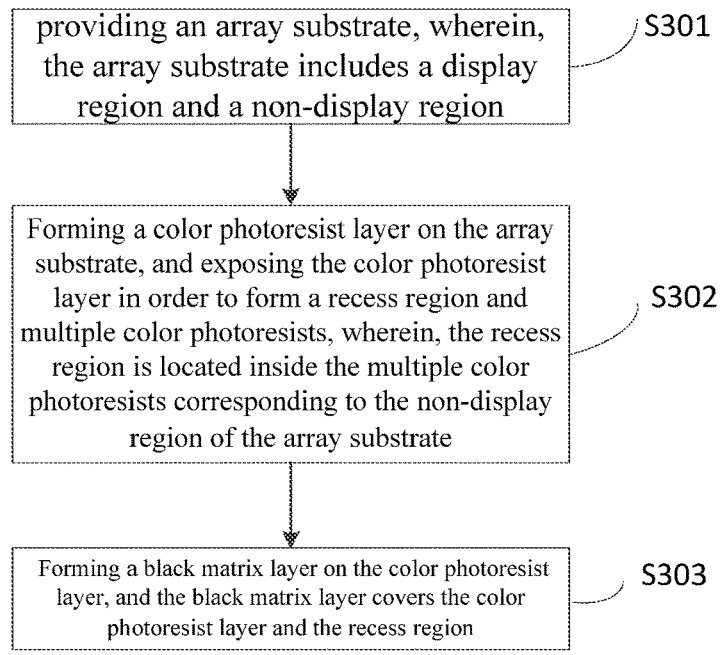
FIG. 5 is a flow chart of a manufacturing method for a display panel based on BOA technology of a third embodiment of the present invention.
Figure 6A:
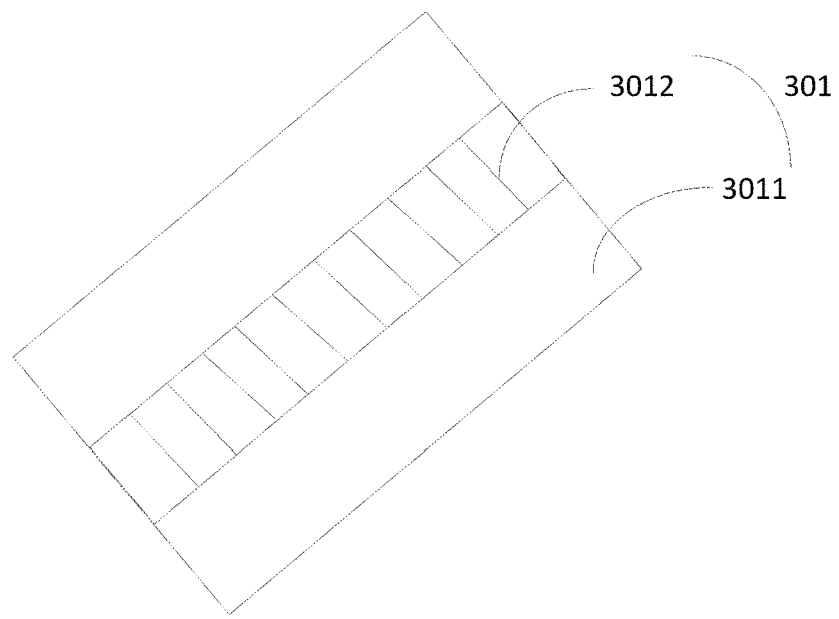
FIG. 6a is a top view of the array substrate in the step S301 in FIG. 5.
Figure 6B:
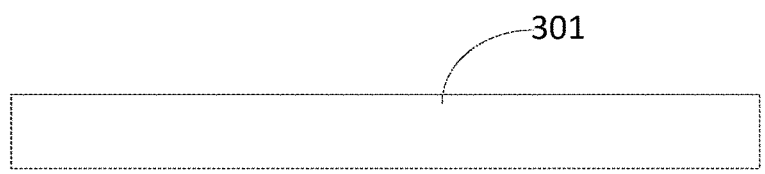
FIG. 6b-FIG. 6g is a cross-sectional view of the display panel of each step in FIG. 5.

With reference to FIG. 5, which is a flow chart of a manufacturing method for a display panel based on BOA technology of a third embodiment of the present invention, FIG. 6b-FIG. 6g is a cross-sectional view of the display panel of each step of the third embodiment of the present invention. As shown in FIG. 5 and FIG. 6, the manufacturing method of the display panel specifically includes following steps:

Step S301: providing an array substrate 301, wherein, the array substrate 301 includes a display region 3011 and a non-display region 3012;

With reference to FIG. 6a-FIG. 6b, wherein, FIG. 6a is a top view of an array substrate 301 manufactured through step S301, FIG. 6b is a cross-sectional view of the array substrate 301. In the array substrate 301 provided, the array substrate 301 can include a data line, a scanning line, a thin-film transistor, a pixel electrode and so on (all not shown in the figures). The array substrate 301 includes a display region 3011 for displaying an image and a non-display region 3012 for separating or distinguishing different pixels.

Step S302: forming a color photoresist layer on the array substrate 301, and exposing the color photoresist layer in order to form a recess region and multiple color photoresists. Wherein, the recess region is located inside the multiple color photoresists corresponding to the non-display region 3012 of the array substrate 301;

Specifically, in the step of forming a color photoresist layer on the array substrate 301, the color photoresist layer can include one or a combination of a red photoresist, a green photoresist and a blue photoresist. Generally, in order to achieve a color display effect, the color photoresist layer should include a red photoresist, a green photoresist and a blue photoresist. The formation of the recess region can be in a process of forming a red color photoresist by exposing a red photoresist layer, in a process of forming a green color photoresist by exposing a green photoresist layer, or in a process of forming a blue color photoresist by exposing a blue photoresist layer.

Figure 6C:
Figure 6D:
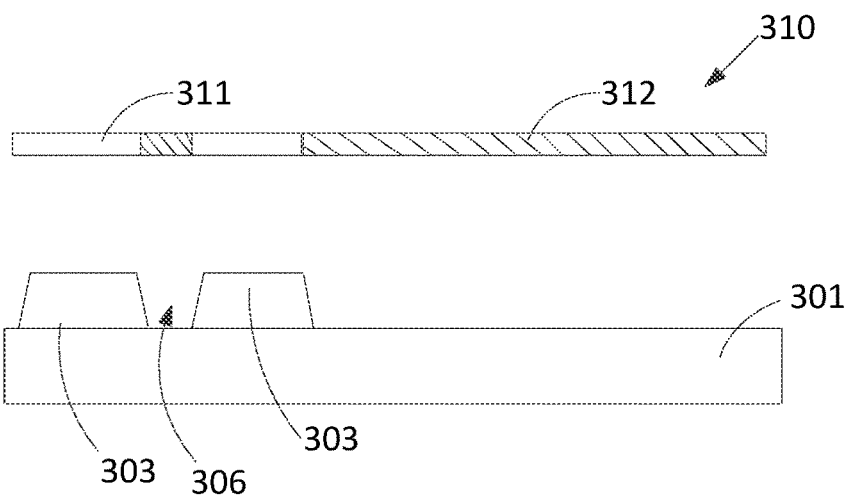
Figure 6E:
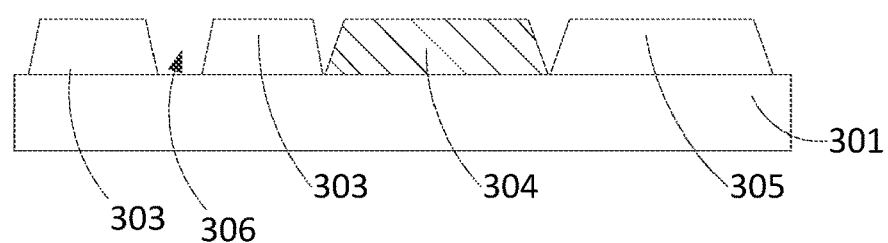

With reference to FIG. 6c-FIG. 6e, which is a cross-sectional view of a display panel after executing the step S302. The present embodiment can form a red photoresist layer 302 on the array substrate 301, as shown in FIG. 6c;

As shown in FIG. 6d, using a mask 310 once to expose the red photoresist layer 302 to form multiple red photoresists 303 and a recess region 306 located inside the multiple red photoresists 303. Wherein, a light transmittance of a first region 311 of the mask 310 corresponding to the red photoresist 303 is greater than a light transmittance of a second region 312 that is a region of the mask except the first region 311. Optionally, the first region 311 is a light-transmitting film, and the second region 312 is a light-blocking film.

It should be noted, the number of the recess regions 306 can be one or multiple, each recess region 306 is located inside the multiple red photoresists 303, and the number of the recess region 306 is not limited.

After forming the red photoresists 303 and the recess region 306, as shown in FIG. 6e, on the array substrate 301, continuously forming a green color resist 304 and a blue color photoresist 305. The red color photoresist 303, the green photoresist 304 and the blue photoresist 305 are all located on the display region 3011 of the array substrate 301, or covering a portion of the non-display region 3012.

Figure 6F:
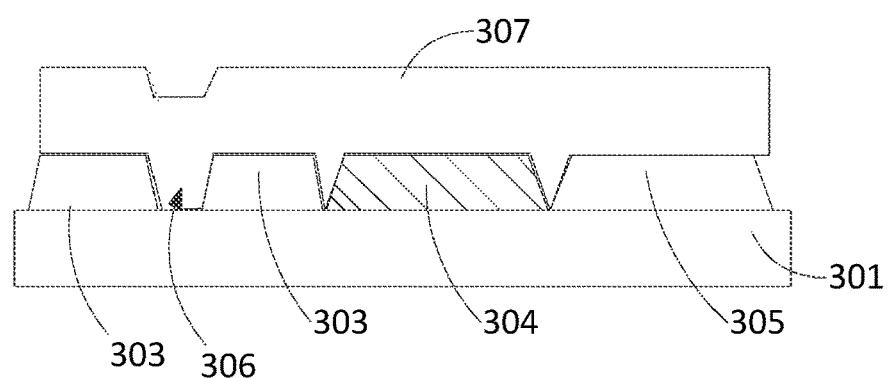

Step S303: forming a black matrix layer 307 on the color photoresist layer, and the black matrix layer 307 covers the color photoresist layer and the recess region 306;

As shown in FIG. 6f, forming a black matrix layer 307 on the red photoresist 303, the green photoresist 304 and the blue photoresist 305 having a certain thickness. The black matrix layer 307 is corresponding to the non-display region 3012 of the array substrate 301. Because the thickness of the coated black matrix layer 307 is consistent, a portion of the black matrix layer 307 located above the recess region 306 is still under a recessed status.

Step S304: exposing the black matrix layer 307 such that a first spacer 308 is formed on the recess region 306, and a second spacer 309 is formed on the color photoresist layer corresponding to the non-display region 3012 of the array substrate 301.

Figure 6G:
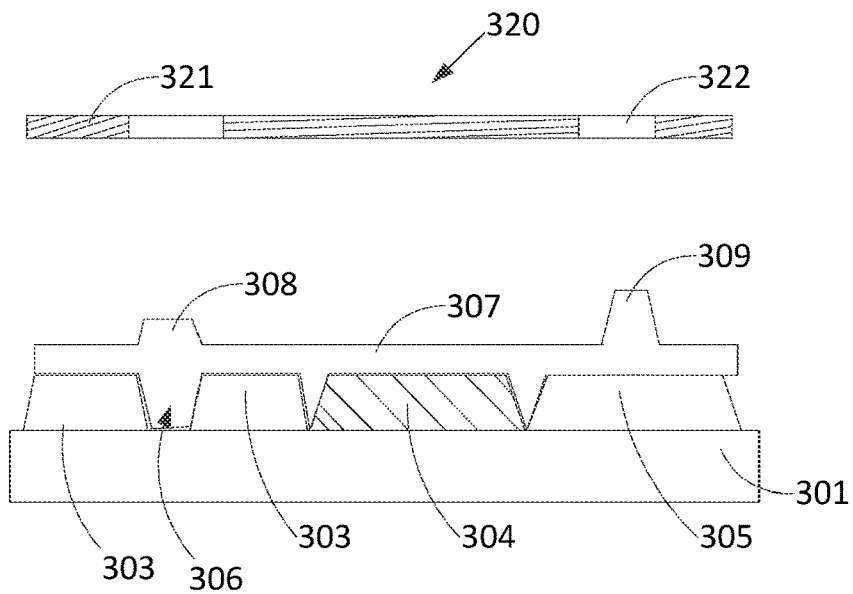

Specifically, as shown in FIG. 6g, the first spacer 308 and the second spacer 309 are both formed in the process of forming the black matrix layer 307. Utilizing the mask 320 once to expose the black matrix layer 307 such that the first spacer 308 is formed on the recess region 306, and the second spacer 309 is formed on the blue photoresist 305;

A light transmittance of the first region 322 of the mask 320 corresponding to the first spacer 308 and the second spacer 309 is greater than a light transmittance of a second region 321 that is a region of the mask 320 except the first region 322. In the present embodiment, the first region 322 is a light-transmitting film, a light transmittance of the second region 321 is greater than a light transmittance of a light-blocking film. A portion of the black matrix layer 307 corresponding to the first region 322 is maintained. The black matrix layer 307 corresponding to the second region 321 leave a remaining portion of the black matrix 307, and a height of the remaining portion of the black matrix 307 is lower than a height of the black matrix layer 397 at the recess region 306. Accordingly, a protruding portion forms the first spacer 308. Similarly, the second spacer 308 is formed on the blue photoresist 305 protruding from the remaining portion of the black matrix layer 307. Through the above way, a process for individually forming the first spacer 308 and the second spacer 309 is reduced such that the manufacturing processes of the display panel are reduced to decrease the production cost.

Figure 6H:
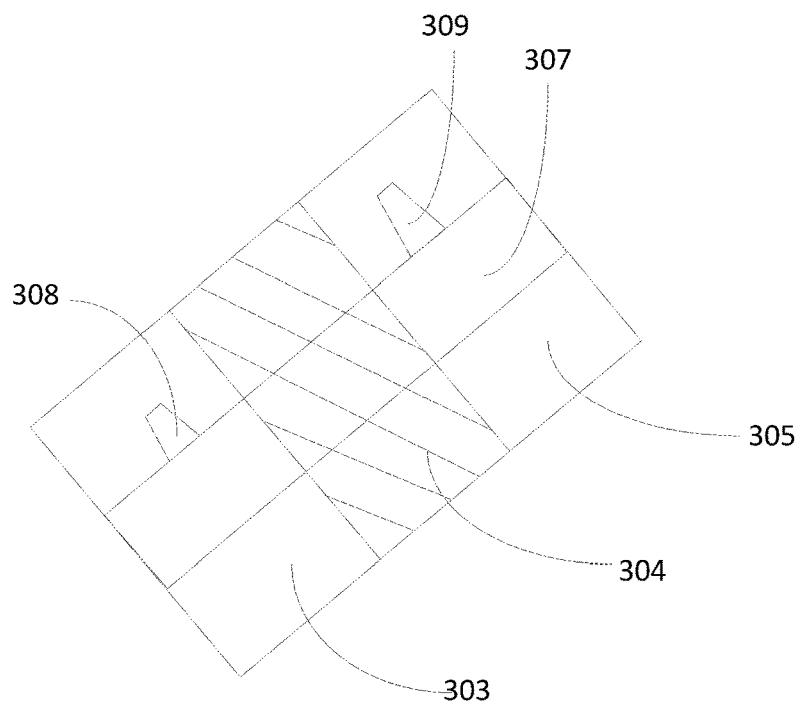
FIG. 6h is a top view of the display panel after the step S303 in FIG. 5.

Utilizing the above steps to finish the red photoresist 303, the green photoresist 304 and the blue photoresist 305, the black matrix layer 307, the first spacer 308 and the second spacer 309. As shown, heights of the first spacer 308 and the second spacer 309 are different, and positions of the first spacer 308 and the second spacer 309 are different; as shown in FIG. 6h, and FIG. 6h is a top view of FIG. 6g. As shown, the black matrix layer 307, the first spacer 308 and the second spacer 309 are all located at the non-display region 3012 of the array substrate 301.

In the present embodiment, in the formation of the color photoresist layer, the recess region 306 is formed at the same time. Accordingly, the mask 320 can only be manufactured by two materials having different light transmittance properties. In another embodiment, if the recess region is not formed with the color photoresist layer, when utilizing a mask once to expose the black matrix layer to form the first spacer and the second spacer at the same time, the mask require three materials having different light transmittance properties, and divided into at least three regions. A light transmittance of a first region of the mask corresponding to the first spacer is different from a light transmittance of a second region of the mask corresponding to the second spacer. A light transmittance of a third region that is a region of the mask except the first region and the second region is different from the light transmittance of previous two regions such that on the color photoresist layer, the first spacer and the second spacer protruding from the black matrix layer and having different heights are formed.

Figure 7:
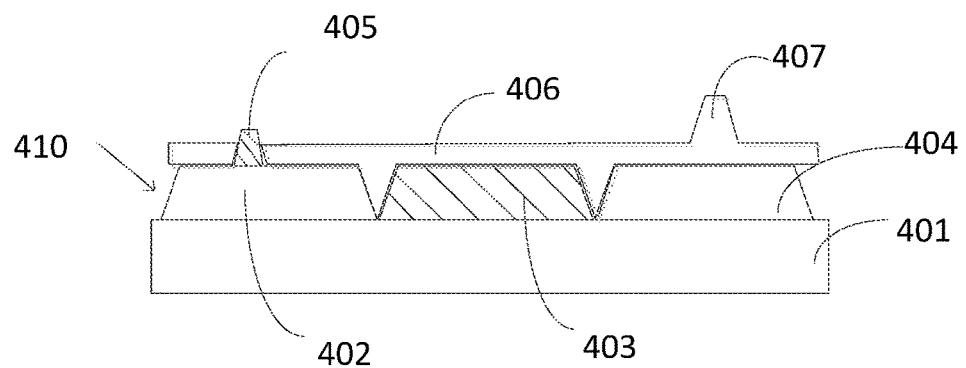
FIG. 7 is schematic diagram of a display panel based on BOA technology of an embodiment of the present invention.
Figure 8:
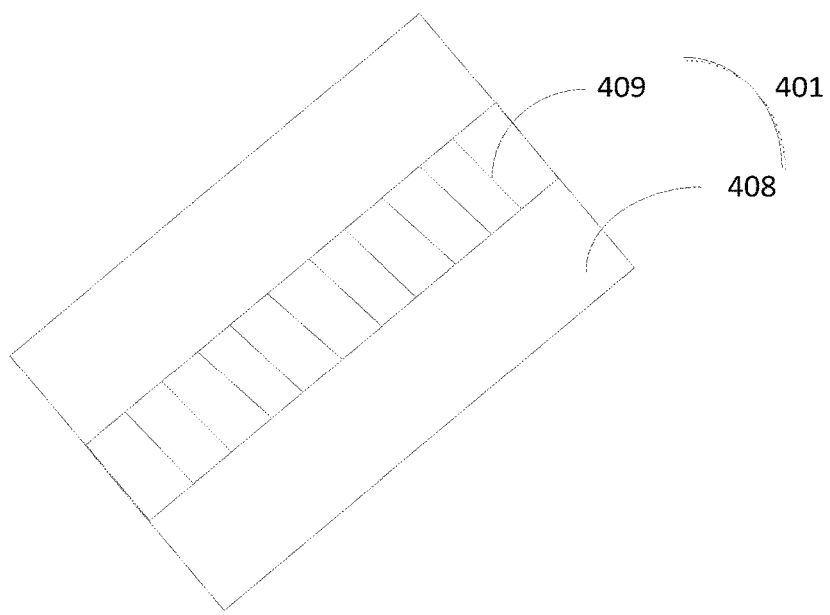
FIG. 8 is a top view of a display panel based on BOA technology of an embodiment of the present invention.

With reference to FIG. 7, which is a display panel based on BOA technology of an embodiment of the present invention, comprising:

an array substrate, as shown in FIG. 8, which is a top view of the array substrate 401, and the array substrate 401 includes a display region 408 and a non-display region 409;

a color photoresist layer 410 disposed on the array substrate 401;

the color photoresist layer 410 can be a red photoresist 402, a green photoresist 403 and a blue photoresist 404. In some situations, one or two of the red photoresist 402, the green photoresist 403 and the blue photoresist 404 can be selected;

a first spacer 405, the first spacer 405 is formed in a formation process of the color photoresist layer 410. In the present embodiment, the first spacer 405 is formed with the green photoresist 403. The green photoresist 403 and the first spacer 405 can be formed by using a mask once for exposing. The mask is manufactured by three materials having different light transmittance properties. The first spacer is 405 located on the red photoresist 402 corresponding to the non-display region 409 of the array substrate 401. The material of the first spacer 405 is the same as the material of the green photoresist 403;

a black matrix layer 406 disposed on the color photoresist layer 410; and a second spacer 407, the second spacer 407 is formed in a formation process of the black matrix layer 406. The second spacer 407 and the black matrix 406 can be formed by using a mask once for exposing. The mask is manufactured by two materials having different light transmittance properties. The second spacer is 407 located on the blue photoresist 404 corresponding to the non-display region 409 of the array substrate 401. The material of the second spacer 407 is the same as the material of the black matrix layer 406.

As shown, heights and positions of the first spacer 405 and the second spacer 407 are different.

In a display panel based on BOA technology of the embodiment of the present invention, through providing an array substrate 401, the array substrate 401 includes a display region 408 and a non-display region 409; forming a color photoresist layer 410 and a black matrix layer 406 on the array substrate 401, in a process of forming the color photoresist layer 410 forming the first spacer 405, and in a process of forming the black matrix layer 406, forming the second spacer 407. In the processes of forming the color photoresist layer 410 and the black matrix layer 406, respectively forming the first spacer 405 and the second spacer 407 in order to reduce a process for individually forming the first spacer 405 and the second spacer 407 such that the manufacturing processes of the display panel are reduced to decrease the production cost.

Another embodiment of a display panel based on the BOA technology can be manufactured by anyone of the three embodiments of the manufacturing method for the display panel based on BOA technology, no more repeating.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a display panel based on BOA technology, comprising:

providing an array substrate, wherein, the array substrate includes a display region and a non-display region;

forming a color photoresist layer on the array substrate;

using a mask once to expose the color photoresist layer in order to form a first spacer corresponding to the non-display region;

forming a black matrix layer on the color photoresist layer;

using a mask once to expose the black matrix layer in order to form a second spacer corresponding to the non-display region and/or the first spacer, wherein, heights and positions of the first spacer and the second spacer are different;

wherein the step of forming a color photoresist layer on the array substrate, and using a mask once to expose the color photoresist layer in order to form a first spacer corresponding to the non-display region comprises:

forming a red photoresist layer on the array substrate;

using a mask once to expose the red photoresist layer to form multiple red photoresists and a recess region located inside the multiple red photoresists, wherein a light transmittance of a first region of the mask corresponding to the red photoresist is greater than a light transmittance of a second region that is a region of the mask except the first region; and forming a green photoresist and a blue photoresist on the array substrate; or wherein the step of forming a color photoresist layer on the array substrate, and using a mask once to expose the color photoresist layer in order to form a first spacer corresponding to the non-display region comprises:

forming a green photoresist layer on the array substrate;

using a mask once to expose the green photoresist layer to form multiple green photoresists and a recess region located inside the multiple green photoresists, wherein a light transmittance of a first region of the mask corresponding to the green photoresist is greater than a light transmittance of a second region that is a region of the mask except the first region; and forming a red photoresist and a blue photoresist on the array substrate; or wherein the step of forming a color photoresist layer on the array substrate, and using a mask once to expose the color photoresist layer in order to form a first spacer corresponding to the non-display region comprises:

forming a blue photoresist layer on the array substrate;

using a mask once to expose the blue photoresist layer to form multiple blue photoresists and a recess region located inside the multiple blue photoresists, wherein a light transmittance of a first region of the mask corresponding to the blue photoresist is greater than a light transmittance of a second region that is a region of the mask except the first region; and forming a red photoresist and a green photoresist on the array substrate.

2. The method according to claim 1, wherein, the step of forming the color photoresist layer on the array substrate comprises:

forming a red photoresist, a green photoresist and a blue photoresist on the array substrate;

and the step of using a mask once to expose the color photoresist layer in order to form a first spacer corresponding to the non-display region comprises:

making one exposure for a red photoresist layer corresponding to the red photoresist in order to form the red photoresist and the first spacer protruding from the red photoresist;

or, making one exposure for a green photoresist layer corresponding to the green photoresist in order to form the green photoresist and the first spacer protruding from the green color photoresist;

or, making one exposure for a blue photoresist layer corresponding to the blue photoresist in order to form the blue photoresist and the first spacer protruding from the blue color photoresist;

wherein, the first spacer is formed on the non-display region of the array substrate corresponding to the red photoresist, the green photoresist or the blue photoresist.

3. The method according to claim 1, wherein, the step of forming the color photoresist layer on the array substrate, using a mask once to expose the color photoresist layer in order to form a first spacer corresponding to the non-display region comprises:

forming a red photoresist on the array substrate;

coating a green photoresist layer on the red photoresist;

using a mask once to expose the green photoresist layer in order to form a green photoresist and a first spacer, wherein, the first spacer is located on the red photoresist corresponding to the non-display region of the array substrate; a light transmittance of a first region of the mask corresponding to the green photoresist is greater than a light transmittance of a second region of the mask corresponding to the first spacer; a remaining region that is a region of the mask except the first region and the second region is light-blocking film; and forming a blue photoresist on the array substrate.

4. The method according to claim 1, wherein the first region of the mask corresponding to the green photoresist is a light-transmitting film, a light transmittance of the second region of the mask corresponding to the first spacer is greater than a light transmittance of the light-blocking film.

5. The method according to claim 1, wherein, the step of using a mask once to expose the black matrix layer in order to form a second spacer corresponding to the non-display region and/or the first spacer comprises:

using a mask once to expose the black matrix layer; and after exposing the black matrix layer, the second spacer is formed on the black matrix layer corresponding to the non-display region, wherein, a light transmittance of a first region of the mask corresponding to the second spacer is greater than a light transmittance of a second region that is a region of the mask except the first region; the black matrix layer corresponding to the second region is reserved.

6. The method according to claim 2, wherein, a first region of the mask is a light-transmitting film, and a light transmittance of a second region of the mask that is a region of the mask except the first region is greater than a light transmittance of the light-blocking film.

7. A manufacturing method for a display panel based on BOA technology, comprising:

providing an array substrate, wherein, the array substrate includes a display region and a non-display region;

forming a color photoresist layer on the array substrate, and exposing the color photoresist layer in order to form a recess region and multiple color photoresists, wherein, the recess region is located inside the multiple color photoresists corresponding to the non-display region of the array substrate;

forming a black matrix layer on the color photoresist layer, and the black matrix layer covers the color photoresist layer and the recess region; and exposing the black matrix layer such that a first spacer is formed on the recess region, and a second spacer is formed on the color photoresist layer corresponding to the non-display region of the array substrate; and wherein, heights and positions of the first spacer and the second spacer are different;

wherein the step of forming a color photoresist layer on the array substrate, and exposing the color photoresist layer in order to form a recess region and multiple color photoresists comprises:

forming a red photoresist layer on the array substrate;

using a mask once to expose the red photoresist layer to form multiple red photoresists and a recess region located inside the multiple red photoresists, wherein a light transmittance of a first region of the mask corresponding to the red photoresist is greater than a light transmittance of a second region that is a region of the mask except the first region; and forming a green photoresist and a blue photoresist on the array substrate; or the step of forming a color photoresist layer on the array substrate, and exposing the color photoresist layer in order to form a recess region and multiple color photoresists comprises:

forming a green photoresist layer on the array substrate;

using a mask once to expose the green photoresist layer to form multiple green photoresists and a recess region located inside the multiple green photoresists, wherein a light transmittance of a first region of the mask corresponding to the green photoresist is greater than a light transmittance of a second region that is a region of the mask except the first region; and forming a red photoresist and a blue photoresist on the array substrate; or the step of forming a color photoresist layer on the array substrate, and exposing the color photoresist layer in order to form a recess region and multiple color photoresists comprises:

forming a blue photoresist layer on the array substrate;

using a mask once to expose the blue photoresist layer to form multiple blue photoresists and a recess region located inside the multiple blue photoresists, wherein a light transmittance of a first region of the mask corresponding to the blue photoresist is greater than a light transmittance of a second region that is a region of the mask except the first region; and forming a red photoresist and a green photoresist on the array substrate.

8. The method according to claim 5, wherein, a first region of the mask corresponding to the red color photoresist is a light-transmitting film, a second region that is a region of the mask except the first region is a light-blocking film.

9. The method according to claim 4, wherein, the step of exposing the black matrix layer such that a first spacer is formed on the recess region, and a second spacer is formed on the color photoresist layer comprises:

using a mask once to expose the black matrix layer such that the first spacer is formed on the recess region, and the second spacer is formed on the color photoresist layer; and wherein, a light transmittance of the first region of the mask corresponding to the first spacer and the second spacer is greater than a light transmittance of a second region that is a region of the mask except the first region.

10. The method according to claim 8, wherein the first region of the mask corresponding to the first spacer and the second spacer is a light-transmitting film, and the light transmittance of the second region that is a region of the mask except the first region is greater than a light transmittance of a light-blocking film.

11. A display panel based on BOA technology, comprising:

an array substrate includes a display region and a non-display region;

a color photoresist layer disposed on the array substrate;

a black matrix layer disposed on the color photoresist layer; and a spacer disposed in the non-display region of the array substrate, and the spacer includes a first spacer and a second spacer, and heights and positions of the first spacer and the second spacer are different;

the first spacer is formed in a formation process of the color photoresist layer; and the second spacer is formed in a formation process of the black matrix layer;

wherein the color photoresist layer includes a red photoresist, a green photoresist and a blue photoresist;

the red photoresist and the first spacer is formed by making one exposure for a red photoresist layer such that multiple red photoresists and a recess region located inside the multiple red photoresists are formed; or, the green photoresist and the first spacer is formed by making one exposure for a green photoresist layer such that multiple green photoresists and a recess region located inside the multiple green photoresists are formed; or, the blue photoresist and the first spacer is formed by making one exposure for a blue photoresist layer such that multiple blue photoresists and a recess region located inside the multiple blue photoresists are formed.

* * * * *